United States Patent
Jozuka

(10) Patent No.: US 12,387,986 B2
(45) Date of Patent: Aug. 12, 2025

(54) SEMICONDUCTOR DEVICE

(71) Applicant: FUJI ELECTRIC CO., LTD., Kawasaki (JP)

(72) Inventor: Naohiko Jozuka, Nagano (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 488 days.

(21) Appl. No.: 17/977,904

(22) Filed: Oct. 31, 2022

(65) Prior Publication Data

US 2023/0187290 A1    Jun. 15, 2023

(30) Foreign Application Priority Data

Dec. 14, 2021   (JP) .................................. 2021-202831

(51) Int. Cl.
| | |
|---|---|
| H01L 21/52 | (2006.01) |
| H01L 23/00 | (2006.01) |
| H01L 23/043 | (2006.01) |
| H01L 23/10 | (2006.01) |

(52) U.S. Cl.
CPC ............ *H01L 23/043* (2013.01); *H01L 21/52* (2013.01); *H01L 23/10* (2013.01); *H01L 24/48* (2013.01); *H01L 24/73* (2013.01); *H01L 2224/48091* (2013.01); *H01L 2224/48227* (2013.01); *H01L 2224/73265* (2013.01); *H01L 2924/16195* (2013.01); *H01L 2924/1715* (2013.01)

(58) Field of Classification Search
CPC ....... H01L 23/043; H01L 21/52; H01L 23/10; H01L 24/48; H01L 24/73; H01L 2224/48091; H01L 2224/48227; H01L 2224/73265; H01L 2924/16195; H01L 2924/1715; H01L 23/3735; H01L 23/49861; H01L 23/053; H01L 23/49811; H01L 25/16; H01L 23/544; H01L 25/072; H01L 23/26; H01L 23/295; H01L 25/18; H01L 2223/54426; H01L 2223/54486; H01L 23/04; H01L 23/24
See application file for complete search history.

(56) References Cited

U.S. PATENT DOCUMENTS

2010/0001174 A1    1/2010 Furuyashiki et al.

FOREIGN PATENT DOCUMENTS

| JP | 2003051560 A | 2/2003 |
|---|---|---|
| JP | 2006185956 A | 7/2006 |
| JP | 2008227231 A | 9/2008 |

*Primary Examiner* — Elias Ullah
(74) *Attorney, Agent, or Firm* — Rabin & Berdo, P.C

(57) ABSTRACT

A semiconductor device, including a semiconductor element; a case having a frame portion, which has an inner periphery that surrounds a housing space for accommodating the semiconductor element; and a lid covering the housing space. The inner periphery of the frame portion has a stepped portion formed thereon, the stepped portion including a step supporting surface positioned at a level lower than a front surface of the frame portion and being approximately parallel to the front surface of the frame portion. The lid has a lateral surface surrounding the lid, and a front surface and a bottom surface approximately parallel to the step supporting surface. The lid has a reservoir formed in the front surface thereof and extending from the lateral surface, the reservoir having a reservoir surface positioned at a level lower than the front surface of the lid.

18 Claims, 11 Drawing Sheets

SEMICONDUCTOR DEVICE

CROSS-REFERENCE TO RELATED APPLICATION

This application is based upon and claims the benefit of priority of the prior Japanese Patent Application No. 2021-202831, filed on Dec. 14, 2021, the entire contents of which are incorporated herein by reference.

BACKGROUND OF THE INVENTION

1. Field of the Invention

The embodiments discussed herein relate to a semiconductor device.

2. Background of the Related Art

Semiconductor devices include power devices and are used as power conversion devices. The power devices are insulated gate bipolar transistors (IGBTs) and power metal oxide semiconductor field effect transistors (MOSFETs). A semiconductor device includes semiconductor chips including power devices, a case that accommodates the semiconductor chips, and a lid that is arranged at the opening of the case to cover the semiconductor chips. The lid is firmly fixed to the opening of the case using an adhesive material.

Please see, for example, Japanese Laid-open Patent Publication No. 2003-051560.

Here, the adhesive material fixing the lid to the case may protrude from the opening of the case. For example, if the case does not have an area large enough to apply the adhesive material, the adhesive material may protrude out of the area. Such protruding adhesive material may be a waste. In addition, if the protruding adhesive material adheres to the lid and case, it means defacing the semiconductor device and reducing its aesthetic value. In addition, the protruding adhesive material may make the surroundings of the semiconductor device dirty. In order to set an area for applying the adhesive material such as to prevent the adhesive material from protruding, the case needs to be enlarged, which leads to increasing the size of the semiconductor device.

SUMMARY OF THE INVENTION

According to one aspect, there is provided a semiconductor device including: a semiconductor element; a case including a frame portion, which is of a frame shape having an opening in a plan view of the semiconductor device, the frame portion having a front surface, and an inner periphery that surrounds a housing space for accommodating the semiconductor element; and a lid having a flat plate shape, the lid covering an upper side of the housing space, wherein the inner periphery of the frame portion has a stepped portion formed thereon, the stepped portion including a step supporting surface positioned at a level lower than the front surface of the frame portion and being approximately parallel to the front surface of the frame portion, the lid has a front surface and a bottom surface, and a lateral surface surrounding the lid, the lateral surface being bonded to the stepped portion via an adhesive material, such that the front surface and the bottom surface of the lid are approximately parallel to the step supporting surface, and the lid has a reservoir formed in the front surface thereof and extending from the lateral surface, the reservoir having a reservoir surface substantially lower than the front surface of the lid.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, some embodiments will be described with reference to the accompanying drawings. In the following description, the terms "front surface" and "top surface" refer to surfaces facing the +Z direction in semiconductor devices 1, 10, and 10a of FIGS. 1, 2 and 9. Similarly, the term "up" refers to the +Z direction in the semiconductor devices 1, 10, and 10a of FIGS. 1, 2 and 9. The terms "rear surface" and "bottom surface" refer to surfaces facing the −Z direction in the semiconductor devices 1, 10, and 10a of FIGS. 1, 2 and 9. Similarly, the term "down" refers to the −Z direction in the semiconductor devices 1, 10, and 10a of FIGS. 1, 2 and 9. The term "side surface" refers to a surface connecting a "front surface" or "top surface" and a "rear surface" or "bottom surface" in the semiconductor devices 1, 10, and 10a of FIGS. 1, 2 and 9. For example, a "side surface" is a surface facing one of the ±X directions and ±Y directions in the semiconductor devices 1, 10, and 10a of FIGS. 1, 2 and 9. The same directionality applies to all drawings. The terms "front surface," "top surface," "up," "rear surface," "bottom surface," "down," and "side surface" are used for convenience to describe relative positional relationships, and do not limit the technical ideas of the embodiments. For example, the terms "up" and "down" are not always related to the vertical directions to the ground. That is, the "up" and "down" directions are not limited to the gravity direction. In addition, in the following description, the term "principal component" refers to a component contained at a volume ratio of 80 vol % or more. An expression "being approximately parallel" means that the angle formed by two objects falls within the range of 170° to 190°, inclusive. An expression "being approximately perpendicular" means that the angle formed by two objects falls within the range of 85° to 95°, inclusive.

First Embodiment

Figure 1:
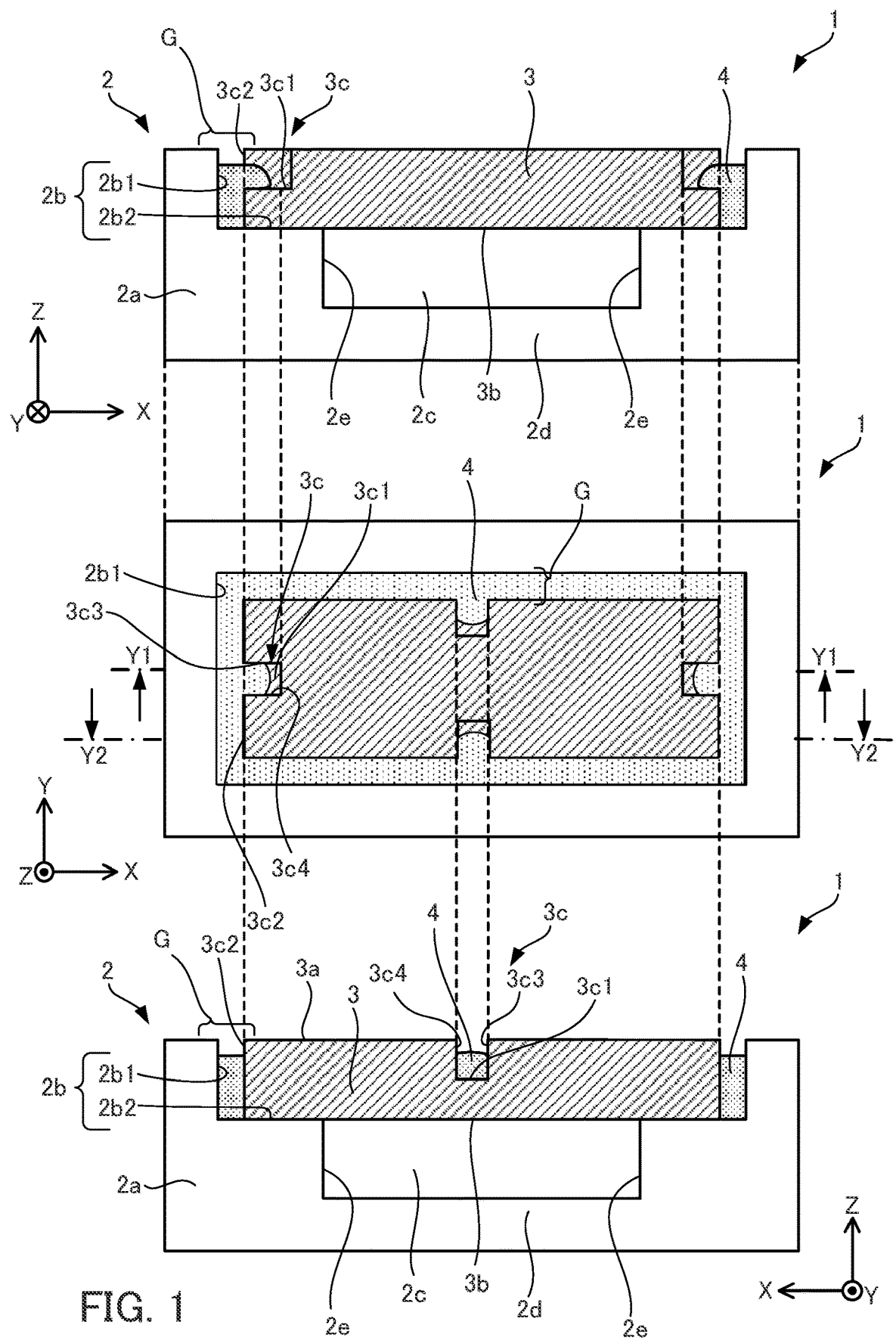
FIG. 1 illustrates a semiconductor device according to a first embodiment.

A semiconductor device 1 according to a first embodiment will be described with reference to FIG. 1. FIG. 1 illustrates a semiconductor device according to the first embodiment. In this connection, the middle part of FIG. 1 is a plan view of the semiconductor device 1 illustrated in the upper part of FIG. 1. The upper part of FIG. 1 is a sectional view taken along the dash-dotted line Y1-Y1 of the semiconductor device 1 illustrated in the middle part of FIG. 1. The lower part of FIG. 1 is a sectional view taken along the dash-dotted line Y2-Y2 of the semiconductor device 1 illustrated in the middle part of FIG. 1.

The semiconductor device 1 of FIG. 1 includes a case 2 and a lid 3 to accommodate semiconductor elements therein. The case 2 has a frame portion 2a, which has a frame shape in plan view, and a bottom portion 2d. The frame portion 2a surrounds a housing space 2c that is an opening to accommodate the semiconductor elements. The semiconductor elements are not illustrated here. In addition, the housing space 2c is rectangular in plan view. Therefore, the frame portion 2a has an opening inner periphery 2e that surrounds the four sides of the housing space 2c. In addition, the frame portion 2a has a stepped portion 2b formed along the opening inner periphery 2e on the front surface side of the frame portion 2a. The case 2 may accommodate any components of the semiconductor device 1, as well as the semiconductor elements. For example, such components include an insulated circuit substrate on which the semiconductor elements are disposed, electronic parts, and a printed circuit substrate. The frame portion 2a is rectangular in plan view, and the housing space 2c and opening inner periphery 2e are rectangular as well. The rectangular shape is assumed to be an oblong shape here, but may is a square shape.

The stepped portion 2b is continuously formed in a loop shape along the opening inner periphery 2e of the frame portion 2a. The stepped portion 2b includes a step inner peripheral surface 2b1 and a step supporting surface 2b2. The step inner peripheral surface 2b1 is formed at the long sides and short sides of the opening inner periphery 2e so as to face the center of the frame portion 2a in plan view. That is, the step inner peripheral surface 2b1 is formed in parallel to the Z-X plane at the opposite long sides of the opening inner periphery 2e and is also formed in parallel to the Z-Y plane at the opposite short sides of the opening inner periphery 2e. The height of the step inner peripheral surface 2b1 depends on the thickness of the lid 3. FIG. 1 illustrates the case where the step inner peripheral surface 2b1 has the same height as the lid 3. The step supporting surface 2b2 is continuously formed in a loop shape along the opening inner periphery 2e so as to be orthogonal to the step inner peripheral surface 2b1 and to face the +Z direction (in parallel to the X-Y plane). The step supporting surface 2b2 is approximately parallel to the front surface of the frame portion 2a. That is, the step supporting surface 2b2 does not have any chamfered portion or recessed portion. The width (the length in the direction from the opening inner periphery 2e toward the center in plan view) of the step supporting surface 2b2 is set so as to support the lid 3, which will be described later. The size of the opening inner periphery 2e is set so that, when the lid 3 is attached to the stepped portion 2b, a gap G is formed between the step inner peripheral surface 2b1 and the lateral surface 3c2 of the lid 3. In this connection, in the illustration of FIG. 1, the size of the lid 3 relative to the case 2 is larger than the actual size, and accordingly the stepped portion 2b is illustrated in large size relative to the case 2.

The bottom portion 2d is formed on the rear surface side of the frame portion 2a. Referring to FIG. 1, the bottom portion 2d is flush with the rear surface of the frame portion 2a. The bottom portion 2d closes the housing space 2c from the bottom. FIG. 1 illustrates the case where the bottom portion 2d is integrally formed with the frame portion 2a. Alternatively, the bottom portion 2d may be formed separately from the frame portion 2a. The bottom portion 2d may be a metal base substrate, for example.

The lid 3 has a flat plate shape, and is rectangular in plan view. The rectangular shape of the lid 3 corresponds to the shape of the opening of the case 2. The lid 3 has the lateral surface 3c2 that surrounds the four sides (opposite long sides and opposite short sides) thereof. This lid 3 is bonded to the stepped portion 2b of the frame portion 2a of the case 2 using an adhesive material 4. Therefore, the housing space 2c of the case 2 is surrounded by the lid 3, frame portion 2a, and bottom portion 2d. In this connection, the lid 3 is attached to the stepped portion 2b of the frame portion 2a of the case 2, as will be described later. At this time, the bottom surface 3b of the lid 3 is entirely level. For example, the outer edge of the bottom surface 3b of the lid 3 is supported by the step supporting surface 2b2 of the stepped portion 2b. The outer edge of the bottom surface 3b of this lid 3 and the rest of the bottom surface 3b are level with each other. The bottom surface 3b of the lid 3 does not have any chamfered portion or recessed portion.

The lid 3 also has a reservoir 3c. The reservoir 3c is formed on the outer periphery of the front surface 3a of the lid 3. The reservoir 3c extends in the direction from the lateral surface 3c2 of the front surface 3a of the lid 3 toward the inner side of the lid 3 (the center of the lid 3) in plan view and has an area that is positioned at a level lower than the front surface 3a of the lid 3 at least on the side where the lateral surface 3c2 is positioned. The reservoir 3c of FIG. 1 includes a reservoir surface 3c1 as such a low-level area. The reservoir surface 3c1 is positioned at a level lower than the front surface 3a of the lid 3 and is parallel to the front surface 3a. The reservoir 3c has inner surfaces 3c3 and 3c4 that are parallel to the long sides of the lid 3 and that connect to the reservoir surface 3c1. The inner surfaces 3c3 and 3c4 connect the reservoir surface 3c1 and the front surface 3a. In this connection, as illustrated in the upper part of FIG. 1, the surfaces connecting the reservoir surface 3c1 and the front surface 3a of the lid 3 are perpendicular to the front surface 3a of the lid 3 and the reservoir surface 3c1. In addition, referring to FIG. 1, such a reservoir 3c is formed at the center of each of the long sides and short sides in the front surface 3a of the lid 3. Alternatively, the reservoir 3c may be continuously formed in a loop shape along the outer periphery of the front surface 3a.

The lid 3 configured as above is attached to the stepped portion 2b of the case 2, and the adhesive material 4 is applied to the gap G between the lateral surface 3c2 of the lid 3 and the step inner peripheral surface 2b1 of the stepped portion 2b of the case 2 and spreads in the gap G. At this time, the adhesive material 4 enters the reservoirs 3c of the lid 3 and is accumulated therein. This prevents the adhesive material 4 from protruding from the gap G.

As described above, the semiconductor device 1 includes the case 2 for accommodating semiconductor elements and the lid 3. The case 2 has the frame portion 2a that has a flame shape in plan view and has the opening inner periphery 2e to surround the housing space 2c for accommodating the semiconductor elements. The lid 3 has a flat plate shape and covers the housing space 2c. On the opening inner periphery 2e of the frame portion 2a, the stepped portion 2b is formed, which includes the step supporting surface 2b2 that is positioned at a level lower than the front surface of the frame portion 2a and is approximately parallel to the front surface of the frame portion 2a. The lid 3 has the lateral surface 3c2 that surrounds the lid 3 and that is bonded to the stepped portion 2b using the adhesive material 4, and the bottom surface 3b that is approximately parallel to the step supporting surface 2b2. The reservoirs 3c each having an area positioned at a level lower than the front surface 3a of the lid 3 are formed from the lateral surface 3c2 toward the inner side of the lid 3 in the front surface 3a of the lid 3.

The adhesive material 4 is applied to the gap G between the lateral surface 3c2 of the lid 3 and the step inner peripheral surface 2b1 of the stepped portion 2b of the case 2 and spreads in the gap G. At this time, the adhesive material 4 enters the reservoirs 3c of the lid 3 and is accumulated therein. This enables preventing the adhesive material 4 from protruding from the gap G, without the need of increasing the size of the semiconductor device 1, and also prevents a waste of the adhesive material 4. Since the adhesive material 4 is prevented from protruding, the adhesive material 4 does not adhere to the lid 3 or case 2, which prevents defacing of the semiconductor device 1. In addition, the adhesive material 4 enters the reservoirs 3c as well as the gap G. Therefore, the bonding area of the adhesive material 4 to the lid 3 increases, as compared with the case where the reservoirs 3c are not formed. Therefore, the bonding force of the lid 3 to the case 2 using the adhesive material 4 is improved.

Second Embodiment

Figure 2:
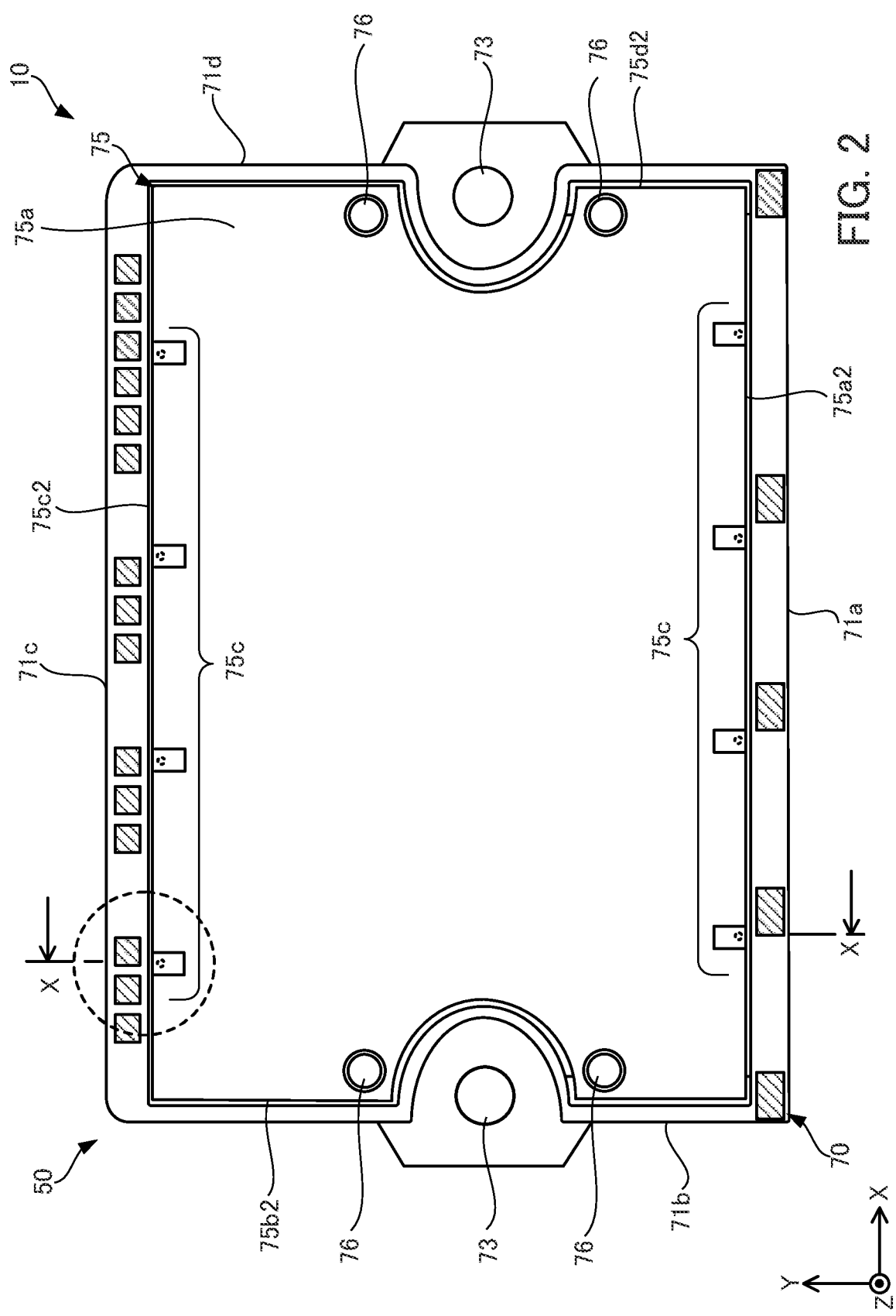
FIG. 2 is a plan view of a semiconductor device according to a second embodiment.
Figure 3:
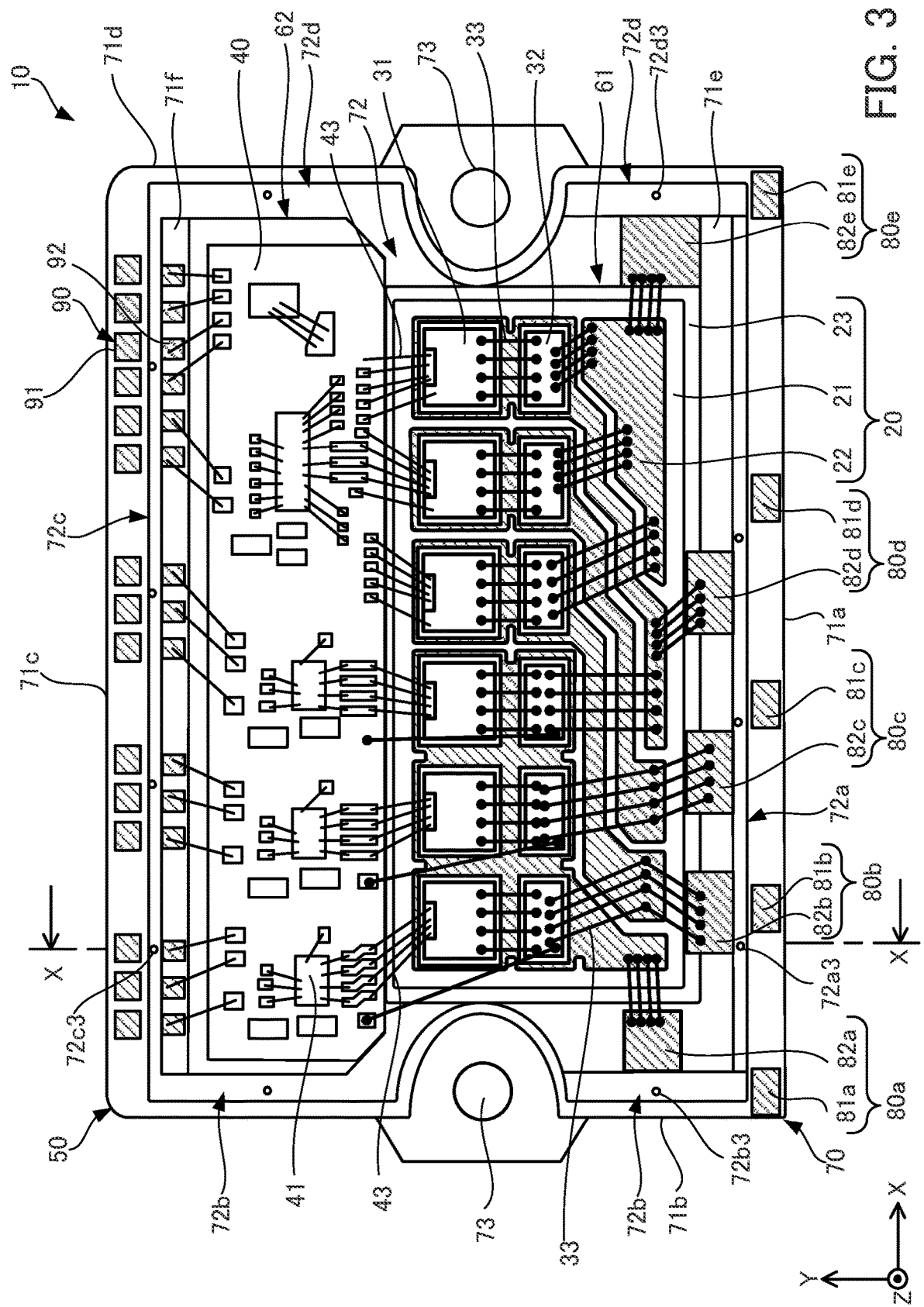
FIG. 3 is a plan view of the inside of the semiconductor device according to the second embodiment.
Figure 4:
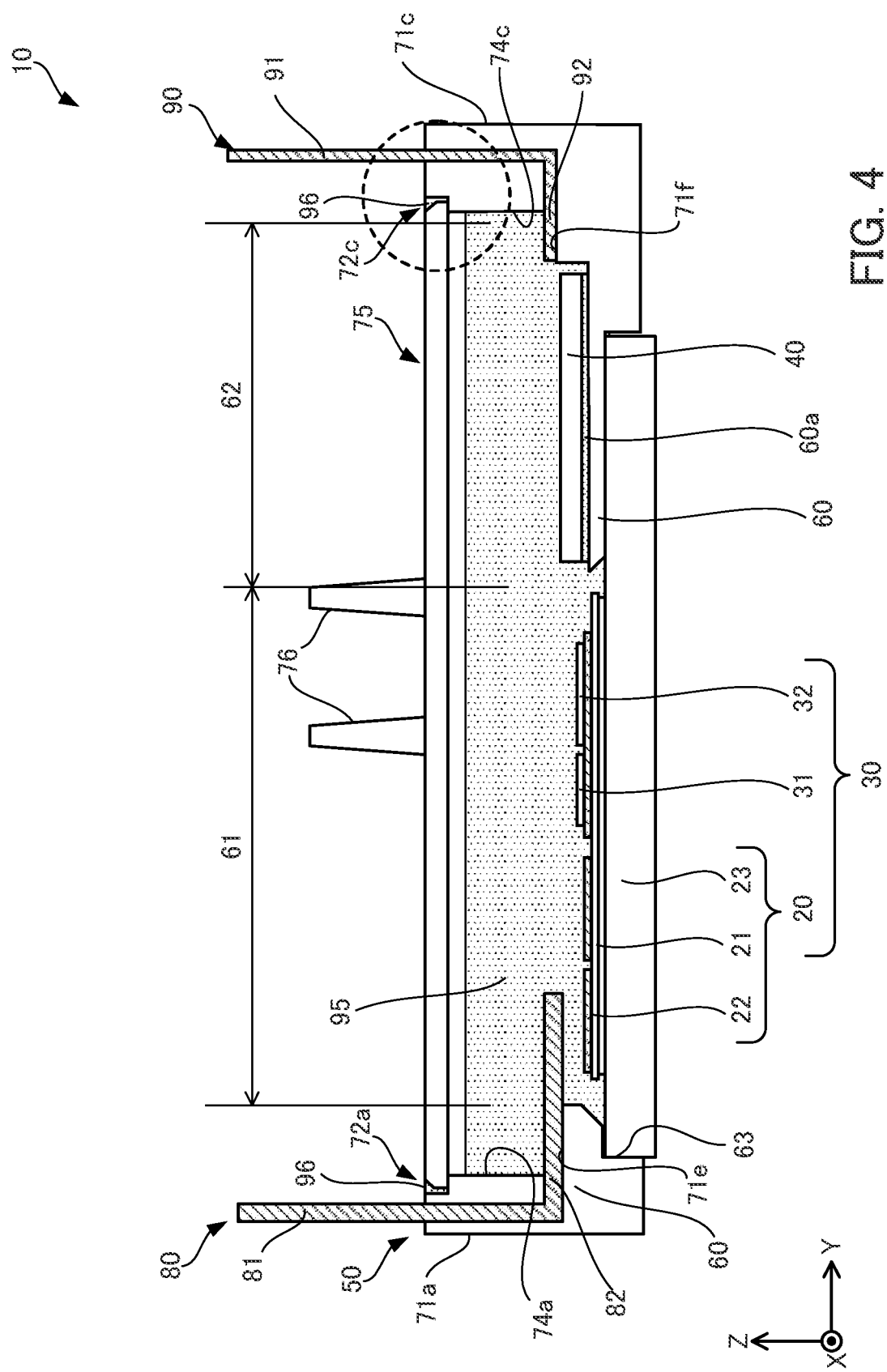
FIG. 4 is a sectional view of the semiconductor device according to the second embodiment.

In a second embodiment, a semiconductor device will be described with reference to FIGS. 2 to 4, more concretely than the semiconductor device 1 of the first embodiment. FIG. 2 is a plan view of the semiconductor device according to the second embodiment, FIG. 3 is a plan view of the inside of the semiconductor device according to the second embodiment, and FIG. 4 is a sectional view of the semiconductor device according to the second embodiment. In this connection, FIG. 3 is a plan view of the semiconductor device 10 without a lid 75 and sealing material 95. FIG. 4 is a sectional view taken along the dash-dotted line X-X of FIG. 2. The position of the dash-dotted line X-X of FIG. 2 corresponds to that of the dash-dotted line X-X of FIG. 3.

The semiconductor device 10 includes a semiconductor unit 30, a printed circuit substrate 40, a case 50 for accommodating the semiconductor unit 30 and printed circuit substrate 40, and a lid 75. The semiconductor unit 30 includes a main circuit substrate 20, and first and second semiconductor chips 31 and 32 mounted on the main circuit substrate 20. In this connection, the semiconductor unit 30 includes six pairs of the first and second semiconductor chips 31 and 32. The main circuit substrate 20 includes an insulating plate 21, circuit patterns 22, and a metal base substrate 23. The main circuit substrate 20 and the printed circuit substrate 40 are disposed adjacent to each other in plan view.

For example, as the insulating plate 21, an organic insulating layer or a ceramic substrate may be used. The organic insulating layer is made of a combination of a resin with low thermal resistance and a material with high thermal conductivity. Examples of the former resin include an epoxy resin and a liquid crystal polymer insulating resin. Examples of the latter material include boron nitride, aluminum oxide, and silicon oxide.

The ceramic substrate is made of ceramics with high thermal conductivity. For example, the ceramics are made from a material containing aluminum oxide, aluminum nitride, or silicon nitride as a principal component. In addition, the insulating plate 21 is rectangular in plan view. The thickness of the insulating plate 21 is in the range of 0.5 mm to 2.0 mm, inclusive.

The circuit patterns 22 form a predetermined circuit. The circuit patterns 22 are formed on the front surface of the insulating plate 21, as illustrated in FIG. 3, for example. On one circuit pattern 22 formed on the left side of the front surface of the insulating plate 21, three pairs of the first and second semiconductor chips 31 and 32 are mounted. On the right side of this circuit pattern 22, three circuit patterns 22 are formed on the front surface of the insulating plate 21 so as to be aligned in the +X direction. One pair of the first and second semiconductor chips 31 and 32 is mounted on each of the three circuit patterns 22. On one circuit pattern 22 formed at the lower right corner on the front surface of the insulating plate 21, nothing is mounted.

In addition, with respect to these circuit patterns 22, their regions where the first and second semiconductor chips 31 and 32 are disposed are aligned in the upper portion of the insulating plate 21 as seen in FIG. 3, and the remaining regions extend downward on the insulating plate 21 as seen in FIG. 3. FIG. 3 merely illustrates the case where the total six pairs of the first and second semiconductor chips 31 and 32 are disposed on the circuit patterns 22. The number of pairs of the first and second semiconductor chips 31 and 32 is not limited to six, but the number of pairs may be determined according to the specifications and others of the semiconductor device 10, and the circuit patterns 22 may be provided according to the pairs. The plurality of circuit patterns 22 are formed on the front surface of the insulating plate 21. The circuit patterns 22 are made of a metal with high electrical conductivity as a principal component. Examples of the metal include silver, copper, nickel, and an alloy containing at least one of these. The thicknesses of the circuit patterns 22 are preferably in the range of 0.1 mm to 1.0 mm, inclusive, and more preferably in the range of 0.2 mm to 0.5 mm. Plating may be performed on the surfaces of the circuit patterns 22 to improve their corrosion resistance. Examples of the plating material used here include nickel, a nickel-phosphorus alloy, and a nickel-boron alloy. The circuit patterns 22 are formed by etching a conductive plate or foil formed on one surface of the insulating plate 21 or by attaching conductive plates to one surface of the insulating plate 21.

The metal base substrate 23 is made of a metal with high thermal conductivity as a principal component. The corners of the metal base substrate 23 may be rounded or chamfered. Examples of the metal include aluminum, iron, silver, copper, and an alloy containing at least one of these. In addition, the metal base substrate 23 is rectangular in plan view and corresponds to a main circuit region 61 and control circuit region 62 (which will be described later) at the bottom portion 60 of the case 50. The thickness of the metal base substrate 23 is in the range of 0.5 mm to 2.0 mm, inclusive. Plating may be performed on the surface of the metal base substrate 23 to improve its corrosion resistance. Examples of the plating material used here include nickel, a nickel-phosphorus alloy, and a nickel-boron alloy.

In this connection, in the case where the insulating plate 21 is a ceramic substrate and the metal base substrate 23 is a metal foil, a direct copper bonding (DCB) substrate or an active metal brazed (AMB) substrate may be used as the circuit patterns 22, insulating plate 21, and metal base substrate 23. In this connection, the shapes, positions, and quantity of the circuit patterns 22 and the positions and quantity of the first and second semiconductor chips 31 and 32 in the semiconductor unit 30 configured as above are just as an example and are not limited to those illustrated in FIGS. 2 to 4, but may be determined according to design and others.

The first and second semiconductor chips 31 and 32 are power semiconductor chips made of silicon, silicon carbide, or gallium nitride. The first semiconductor chips 31 include a switching element. The switching element is an IGBT or a power MOSFET, for example. In the case where a first semiconductor chip 31 is an IGBT, the first semiconductor chip 31 has a collector electrode serving as a main electrode on the rear surface thereof and has a gate electrode serving as a control electrode and an emitter electrode serving as a main electrode on the front surface thereof. In the case where a first semiconductor chip 31 is a power MOSFET, the first semiconductor chip 31 has a drain electrode serving as a main electrode on the rear surface thereof and has a gate electrode serving as a control electrode and a source electrode serving as a main electrode on the front surface thereof. The rear surfaces of the first semiconductor chips 31 are bonded to the circuit patterns 22 via a bonding material (not illustrated). As the bonding material, a solder or a sintered metal is used in the present embodiment. The solder is a lead-free solder containing a predetermined alloy as a principal component. For example, the predetermined alloy is any one of a tin-silver alloy, a tin-zinc alloy, and a tin-antimony alloy. The solder may contain an additive such as copper, bismuth, indium, nickel, germanium, cobalt, or silicon. As the sintered metal, aluminum or copper is used, for example.

The second semiconductor chips 32 include a diode element. The diode element is a free wheeling diode (FWD) such as a Schottky barrier diode (SBD) or a P-intrinsic-N (PiN) diode, for example. A second semiconductor chip 32 of this type has an output electrode (a cathode electrode) serving as a main electrode on the rear surface thereof and has an input electrode (an anode electrode) serving as a main electrode on the front surface thereof. The rear surfaces of the second semiconductor chips 32 are bonded to the circuit patterns 22 using the bonding material.

The thicknesses of these first and second semiconductor chips 31 and 32 are in the range of 180 μm and 220 μm, inclusive, for example, and are 200 μm on average. In place of the first and second semiconductor chips 31 and 32, reverse-conducting (RC)-IGBT chips that have the functions of both IGBT and FWD may be used.

The printed circuit substrate 40 is disposed adjacent to the main circuit substrate 20 disposed via an adhesive material 60a in parallel to the bottom surface of the case 50, and is positioned above the main circuit substrate 20 in the +Z direction. This printed circuit substrate 40 includes an insulating plate and a plurality of upper circuit patterns formed on the front surface of the insulating plate. In addition, the printed circuit substrate 40 may include a plurality of lower circuit patterns formed on the rear surface of the insulating plate.

The insulating plate is made of an insulating material in a flat plate shape. As such a material, a material obtained by immersing a base in a resin is used. Examples of the base includes a paper, glass cloth, and glass unwoven fabric. Examples of the resin include a phenolic resin, an epoxy resin, and a polyimide resin. Specific examples of the insulating plate include a paper phenolic board, a paper epoxy board, a glass epoxy board, a glass polyimide board, and a glass composite board. The insulating plate is rectangular in plan view. The corners of the insulating plate may be rounded or chamfered.

The plurality of upper circuit patterns and lower circuit patterns have predetermined different pattern shapes so as to implement a predetermined circuit. The upper circuit patterns and lower circuit patterns are made of a material with high electrical conductivity. Examples of this material include silver, copper, nickel, and an alloy containing at least one of these. Plating may be performed on the surfaces of the upper circuit patterns and lower circuit patterns to improve their corrosion resistance. Examples of the plating material used here include nickel, a nickel-phosphorus alloy, and a nickel-boron alloy.

For example, the printed circuit substrate 40 is formed as follows. A metal foil is attached to each of the front surface and rear surface of the insulating plate, and resists in predetermined shapes are printed thereon. Then, the metal foils on the front surface and rear surface of the insulating plate are etched using the printed resists as masks, and the remaining resists are removed. By doing so, the upper circuit patterns and lower circuit patterns are obtained on the front surface and rear surface of the insulating plate.

In addition, the printed circuit substrate 40 has control integrated circuits (ICs) 41 as electronic parts, which are electrically connected to the upper circuit patterns. In the present embodiment, the control ICs 41 are electrically and mechanically connected to the gate electrodes (control electrodes) of the first semiconductor chips 31 via bonding wires 43, as illustrated in FIG. 3. The control ICs 41 apply control voltage to the first semiconductor chips 31 at predetermined timing. The bonding wires 43 used here are made of a material with high electrical conductivity. Examples of the material include gold, silver, copper, aluminum, and an alloy containing at least one of these. The diameters of the bonding wires 43 are in the range of 100 μm to 250 μm, inclusive, for example. In this connection, other electronic parts may be mounted on the printed circuit substrate 40 as needed, in addition to the control ICs 41. Examples of such electronic parts include a thermistor, a capacitor, a resistor, a current sensor, and a temperature sensor.

In addition, in the main circuit substrate 20, first and second semiconductor chips 31 and 32 are electrically and mechanically connected to each other with bonding wires 33, and a second semiconductor chip 32 and a circuit pattern 22 are electrically and mechanically connected to each other with bonding wires 33. In addition, the printed circuit substrate 40 and circuit patterns 22 of the main circuit substrate 20 are electrically and mechanically connected with bonding wires 33. The bonding wires 33 used here are made of a material among the above-listed materials with high electrical conductivity. The diameters of the bonding wires 33 are in the range of 400 μm to 1.00 mm, inclusive, for example.

The case 50 will now be described. The case 50 has the bottom portion 60 and a frame portion 70 that is integrally formed with the bottom portion 60 and that surrounds the periphery of the bottom portion 60. In addition, the case 50 includes main current connection terminals 80a to 80e and control terminals 90. In the following, the main current connection terminals 80a to 80e are collectively referred to as "main current connection terminals 80" and individually as "main current connection terminal 80" when the distinction among them is not needed.

The case 50 is made of a thermoplastic resin. Examples of the thermoplastic resin includes a polyphenylene sulfide (PPS) resin, a polybutylene terephthalate (PBT) resin, a polybutylene succinate (PBS) resin, a polyamide (PA) resin, and an acrylonitrile-butadiene-styrene (ABS) resin. The case 50 is formed from such a thermoplastic resin by injection molding so as to be integrally formed with the main current connection terminals 80 and control terminals 90.

The bottom portion 60 is rectangular in plan view. On the bottom surface that is the front surface of the bottom portion 60, the main circuit region 61 and control circuit region 62 are set. The main circuit region 61 of the bottom surface is an opening. The main circuit substrate 20 is disposed in the main circuit region 61, and the printed circuit substrate 40 is disposed in the control circuit region 62. That is, as illustrated in FIG. 3, the main circuit region 61 and control circuit region 62 are set adjacent to each other in plan view on the front surface of the bottom portion 60. In this connection, the opening edge of the main circuit region 61, which is an opening, on the rear surface side thereof may be tapered. In addition, a rear opening 63 is formed in the rear surface of the bottom portion 60. In this connection, the area of the rear opening 63 corresponding to the main circuit region 61 penetrates through the bottom portion 60. The semiconductor unit 30 is attached to the bottom portion 60 from the rear surface side. That is, the metal base substrate 23 is attached to the rear opening 63, and the main circuit substrate 20 is exposed in the main circuit region 61 that is an opening. In this connection, the metal base substrate 23 is attached to the rear opening 63 of the bottom portion 60 using an adhesive material (not illustrated). The rear surface of thus attached metal base substrate 23 protrudes from the rear surface of the bottom portion 60 to the outside (downward in FIG. 4). Alternatively, the rear surface of the metal base substrate 23 may be flush with the rear surface of the bottom portion 60.

As the adhesive material for bonding the metal base substrate 23 to the rear opening 63 of the bottom portion 60, a thermosetting resin-based adhesive agent or an organic-based adhesive agent is used, for example. For example, the thermosetting resin-based adhesive agent contains an epoxy resin or a phenolic resin as a principal component. For example, the organic-based adhesive agent is an elastomer-based adhesive agent containing silicone rubber or chloroprene rubber as a principal component. The adhesive material preferably contains an epoxy resin or silicone rubber as a principal component.

On the front surface of the bottom portion 60, the control circuit region 62 is set adjacent to the main circuit region 61 at the side thereof opposite to the side wall 71a. The printed circuit substrate 40 is disposed in the control circuit region 62 of the bottom surface of the bottom portion 60 using the above-described bonding material.

The frame portion 70 has a frame shape in plan view. The frame portion 70 has side walls 71a, 71b, 71c, and 71d that surround the four sides of the bottom portion 60. In addition, the side walls 71a, 71b, 71c, and 71d respectively have opening inner peripheries that surround the housing space 72. Out of the opening inner peripheries, FIG. 4 illustrates the opening inner peripheries 74a and 74c included in the side walls 71a and 71c. The opening inner peripheries included in the side walls 71b and 71d are provided in the same manner as the opening inner peripheries 74a and 74c although the illustration of them is omitted. The side walls 71a, 71b, 71c, and 71d all have the same height. The side walls 71a and 71c are provided at the long sides of the bottom portion 60. The main current connection terminals 80a to 80e are formed by integral molding with the side wall 71a and bottom portion 60 so as to be arranged along the side wall 71a. The control terminals 90 are formed by integral molding with the side wall 71c and bottom portion 60 so as to be arranged along the side wall 71c.

In addition, stepped portions 72a, 72b, 72c, and 72d are formed along the inner periphery on the front surface side of the side walls 71a, 71b, 71c, and 71d. In this connection, the stepped portions 72b and 72d respectively formed on the side walls 71b and 71d extend along the edges of fastening holes 73, which will be described later. Projections 72a3, 72b3, 72c3, and 72d3 are formed on the stepped portions 72a, 72b, 72c, and 72d, respectively. These stepped portions 72a, 72b, 72c, and 72d will be described in detail later.

The main current connection terminal 80 has an L shape in side view, as illustrated in FIG. 4. More specifically, the main current connection terminal 80 is formed by bending a plate member in an L shape. For example, The thickness of the main current connection terminal 80 is greater than or equal to 100 μm and less than 1.0 mm, and the width thereof is in the range of 1.0 mm to 10 mm, inclusive.

The main current connection terminal 80a has an external connection portion 81a and an internal connection portion 82a. One end portion of the external connection portion 81a extends upward from the top surface of the side wall 71a, and the other end portion thereof is integrally connected to one end of the internal connection portion 82a inside the side wall 71a and bottom portion 60. The other end portion of the internal connection portion 82a is exposed on a terminal stepped portion 71e of the bottom portion 60. The other end portion of the internal connection portion 82a is electrically and mechanically connected to a circuit pattern 22 with the bonding wires 33. Similarly, the main current connection terminals 80b to 80e have external connection portions 81b to 81e and internal connection portions 82b to 82e, respectively. One end portion of each of the external connection portions 81b to 81e extends upward from the top surface of the side wall 71a, and the other end portion thereof is integrally connected to one end of the corresponding internal connection portion 82b to 82e inside the side wall 71a and the bottom portion 60. The other end portions of the internal connection portions 82b to 82e are exposed from the bottom portion 60. The other end portions of the internal connection portions 82b to 82e are electrically and mechanically connected to the circuit patterns 22 with the bonding wires 33. In this connection, as illustrated in FIG. 4, the external connection portions 81a to 81e and internal connection portions 82a to 82e of the main current connection terminals 80a to 80e are collectively referred to as "external connection portions 81" and "internal connection portions 82" and individually as "external connection portion 81" and "internal connection portion 82" when the distinction among them is not needed. The main current connection terminal 80 is made of a material with high electrical conductivity. Examples of the material include copper, aluminum, nickel, and an alloy containing at least one of these. Plating may be performed on the surface of the main current connection terminal 80 to improve its corrosion resistance. Examples of the plating material used here include nickel and a nickel alloy.

As illustrated in FIG. 4, each control terminal 90 has an L shape in side view. More specifically, the control terminal 90 is formed by bending a columnar member in an L shape. The control terminal 90 has an external terminal portion 91 and an internal terminal portion 92. One end portion of the external terminal portion 91 extends upward from the top surface of the side wall 71c, and the other end portion thereof is integrally connected to one end of the internal terminal portion 92 inside the side wall 71c and the bottom portion 60. The other end portion of the internal terminal portion 92 is exposed on a terminal stepped portion 71f of the bottom portion 60. The other end portion of the internal terminal portion 92 is electrically and mechanically connected to the printed circuit substrate 40 with a bonding wire 33. In this manner, the internal terminal portion 92 of the control terminal 90 is electrically connected to the upper circuit pattern or lower circuit pattern of the printed circuit substrate 40. When a control signal is input from the outside to the external terminal portion 91 of the control terminal 90, the internal terminal portion 92 of the control terminal 90 and the printed circuit substrate 40 are made conductive. Then, when a control signal is input from the printed circuit substrate 40 to a control IC 41, the control signal is output from the control IC 41 to the gate electrode of a first semiconductor chip 31 via a bonding wire 43.

The control terminals 90 are made of a material with high electrical conductivity. Examples of the material include copper, aluminum, nickel, and an alloy containing at least one of these. Plating may be performed on the surface of the control terminals 90 to improve their corrosion resistance. Examples of the plating material used here include nickel and a nickel alloy.

The side walls 71b and 71d are provided at the short sides of the bottom portion 60, respectively. The fastening holes 73 for attaching a cooling unit to the rear surface of the semiconductor device 10 are provided in the side walls 71b and 71d, respectively. The cooling unit (not illustrated) is attached to the rear surface (rear surface of the metal base substrate 23) of the semiconductor device 10 and is fixed thereto by inserting screws into the fastening holes 73. At this time, the cooling unit may be attached to the rear surface of the semiconductor device 10 via a solder, a silver solder, a thermal grease, or a thermal sheet so as to improve the heat dissipation property. For example, the cooling unit in this case is made of a metal with high thermal conductivity as a principal component. Examples of the metal include aluminum, iron, silver, copper, and an alloy containing at least one of these. In addition, a heat sink or a cooling device using cool water may be used as the cooling unit, for example. In addition, the metal base substrate 23 may be integrally formed with such a cooling unit.

A sealing material 95 is injected into the housing space 72 of the case 50 accommodating the above-described components, so that the housing space 72 is sealed with the sealing material 95. The sealing material 95 contains a thermosetting resin and an inorganic filler, which is added to the thermosetting resin. For example, the thermosetting resin contains, as a principal component, at least one selected from the group of an epoxy resin, phenolic resin, and melamine resin. The thermosetting resin preferably contains the epoxy resin as a principal component. As the inorganic filler, an inorganic containing silicon oxide as a principal component is used. In addition, without the need of mixing flame retardant such as halogen-based, antimony-based, or metal hydroxide-based flame retardant, high flame retardancy is obtained. The content of the inorganic filler in the whole sealing material is in the range of 70 vol % to 90 vol %, inclusive.

The lid 75 has a flat plate shape and is approximately rectangular in plan view. More specifically, the shape of the lid 75 in plan view corresponds to the shape of the opening of the housing space 72. The lid 75 has lateral surfaces 75a2, 75b2, 75c2, and 75d2 that surround the four sides thereof. In this connection, the lateral surfaces 75a2 and 75c2 correspond to the long sides of the lid 75 and are parallel to the ±X directions. The lateral surfaces 75b2 and 75d2 correspond to the short sides of the lid 75 and are parallel to the ±Y directions. In this connection, the centers of the lateral surfaces 75b2 and 75d2 are recessed toward the center due to the fastening holes 73 in plan view. In addition, when the lid 75 is attached to the stepped portions 72a, 72b, 72c, and 72d of the case 50, as will be described later, the lateral surfaces 75a2, 75b2, 75c2, and 75d2 are approximately parallel to the step inner peripheral surface (refer to a step inner peripheral surface 72c1 of FIG. 6). The thickness of the lid 75 is in the range of 1.8 mm to 2.2 mm, inclusive, for example, and may be set to 2.0 mm. Positioning members 76 and reservoirs 75c are formed in the front surface 75a of the lid 75. In addition, fixing holes (refer to a fixing hole 75b1 of FIG. 6) are formed in the rear surface 75b of the lid 75. The fixing holes will be described in detail later.

Two positioning members 76 are formed at each short side on the front surface 75a of the lid 75, for example. The positioning members 76 each have a columnar shape whose cross section decreases in the +Z direction, for example. A printed circuit substrate is separately attached to the positioning members 76. The positions of the positioning members 76 are just as an example.

A plurality of reservoirs 75c are formed on the outer periphery of the opposite long sides in the front surface 75a of the lid 75. Here, four reservoirs 75c are formed at each of the opposite long sides. The positions and quantity of the reservoirs 75c are just as an example, and the reservoirs 75c may be formed anywhere on the outer periphery of the lid 75, and any number of reservoirs 75c may be formed.

In this connection, when the case 50 is fixed to a predetermined position via the fastening holes 73, the case 50 may partly be curved and warped. If the case 50 is warped, the lid 75 may be separated from the frame portion 70 at the warped area even when the lid 75 is attached to the stepped portions 72a, 72b, 72c, and 72d using the adhesive material 96. Therefore, the reservoirs 75c may preferably be formed at positions of the outer periphery of the lid 75 corresponding to positions where the frame portion 70 is likely to be warped. The positions where the warpage is likely to occur depend on the positions of the fastening holes 73 in the case 50. For example, in the present embodiment, the frame portion 70 is rectangular in plan view, and the fastening holes 73 are formed at the centers of the short sides of the frame portion 70, respectively. In this case, the case 50 is probably warped in a convex shape in the +Z direction, along the center line passing through the center of each of the opposite long sides of the case 50. Therefore, the reservoirs 75c are preferably formed on the outer periphery of the long sides of the lid 75.

In addition, in the present embodiment, the positioning members 76 are formed at the short sides of the lid 75. It is preferable not to form the reservoirs 75c in the vicinity of the positioning members 76. When a printed circuit substrate is attached to the positioning members 76, stress (in the −Z direction) according to the attachment of the printed circuit substrate is generated in the vicinity of the connection areas of the positioning members 76 in the lid 75. Note that the portions of the lid 75 where the reservoirs 75c are formed are thinner than the rest of the lid 75 and are thus weak in strength. Therefore, if a reservoir 75c is formed in the vicinity of such a connection area, the portion of the lid 75 where the reservoir 75c is formed may be damaged in some cases. For this reason, the reservoirs 75c are avoided from being formed at the short sides of the lid 75 where the positioning members 76 are provided. In this connection, the "vicinity" mentioned here may mean an area ranging from a positioning member 76 to a position apart from the positioning member 76 by a length corresponding to the depth of the stepped portion 72b or 72d.

The lid 75 configured as above is firmly fixed to the stepped portions 72a, 72b, 72c, and 72d of the frame portion 70 using the adhesive material 96. The fixed lid 75 covers the sealing material 95 filling the housing space 72.

Figure 5:
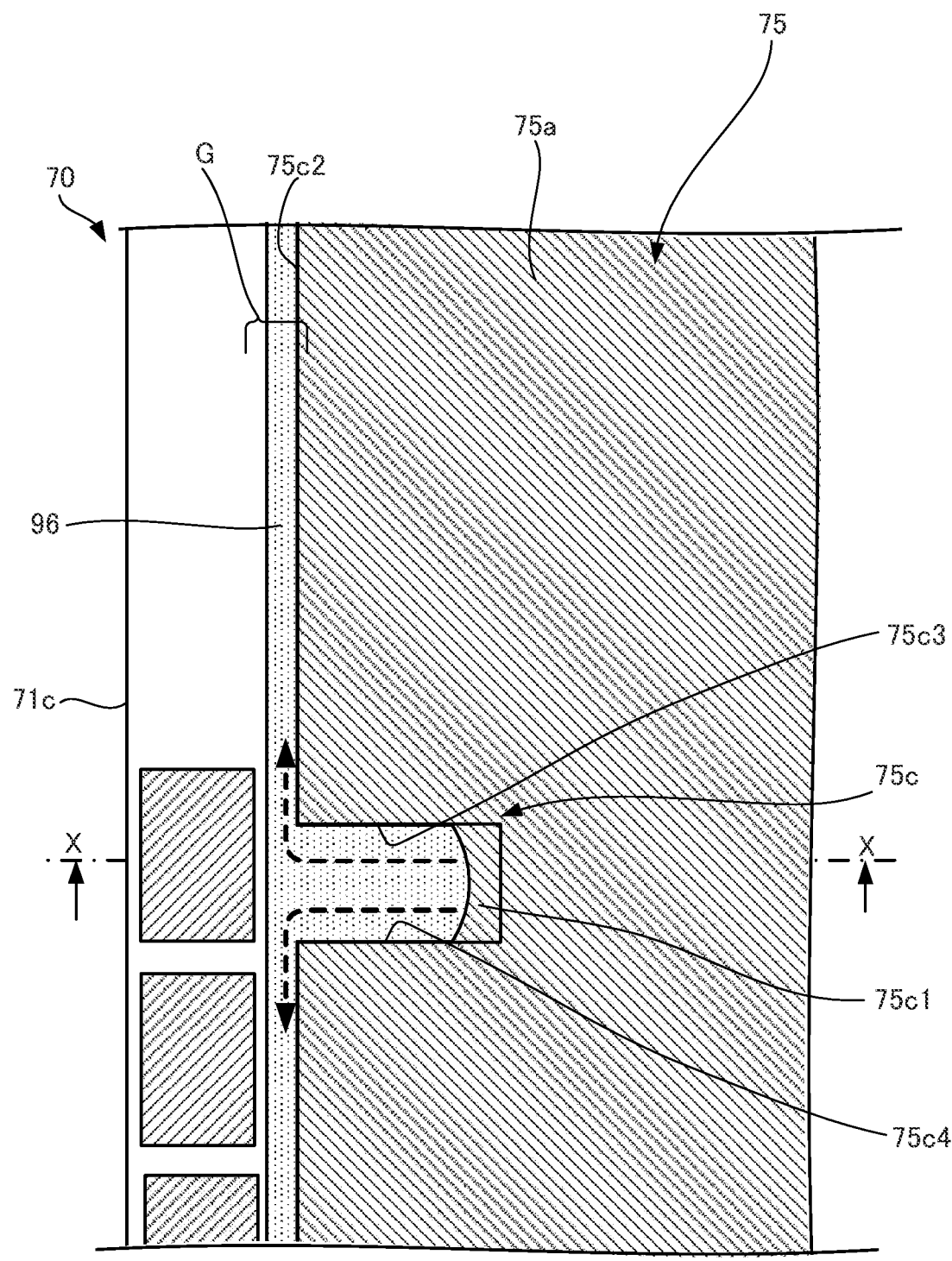
FIG. 5 is a plan view of an area where a lid and a case are attached to each other in the semiconductor device according to the second embodiment.
Figure 6:
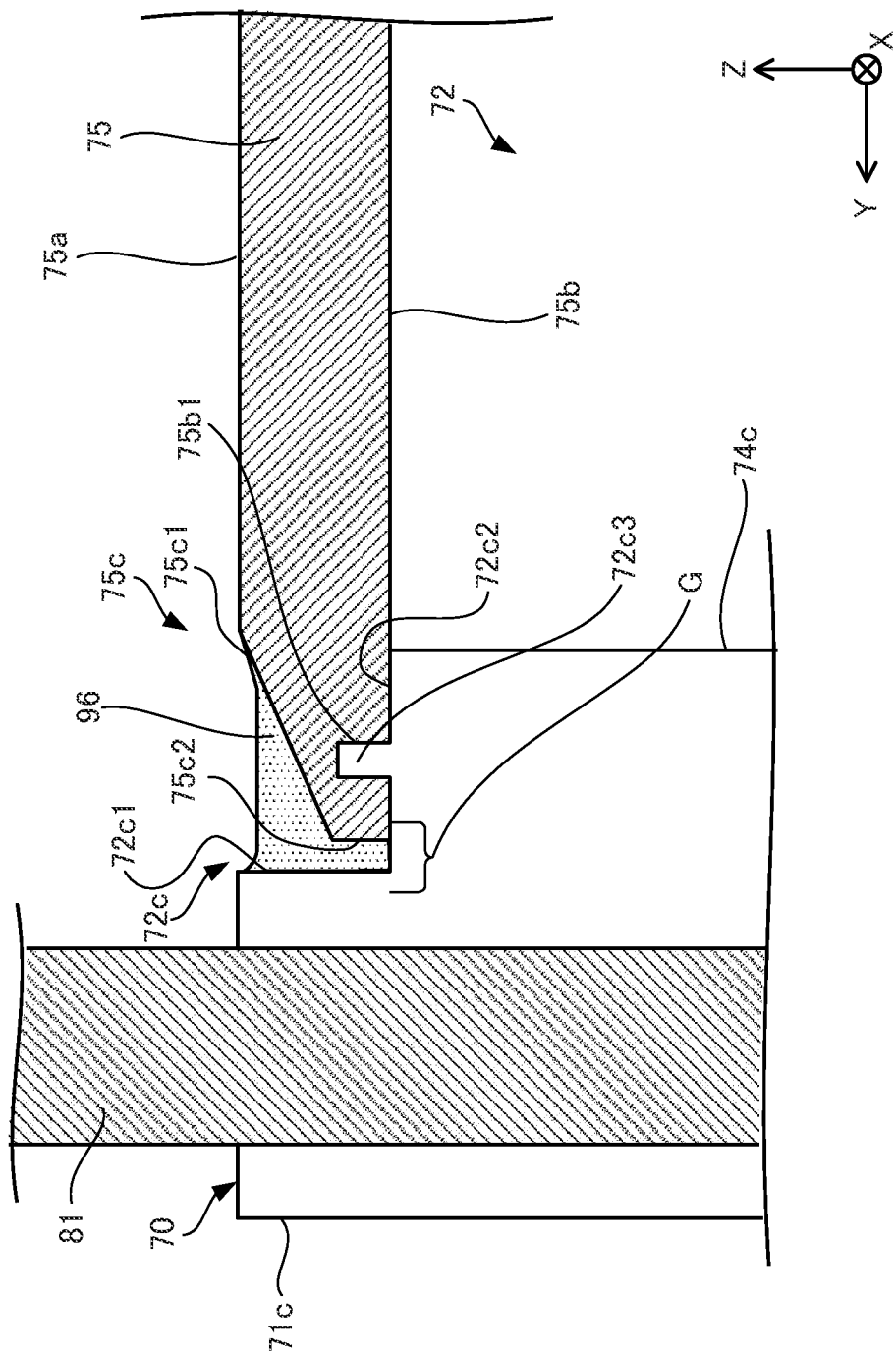
FIG. 6 is a sectional view of the area where the lid and the case are attached to each other in the semiconductor device according to the second embodiment.

The following describes an area where the lid 75 is attached to the case 50 (enclosed by a dashed line in FIGS. 2 and 4) with reference to FIGS. 5 and 6. FIG. 5 is a plan view of the area where the lid and the case are attached to each other in the semiconductor device according to the second embodiment. FIG. 6 is a sectional view of the area where the lid and the case are attached to each other in the semiconductor device according to the second embodiment. In this connection, FIG. 5 is an enlarged view of the area enclosed by the dashed line of FIG. 2. FIG. 6 is a sectional view taken along the dash-dotted line X-X of FIG. 5. In addition, a reservoir 75c of the lid 75 attached to the stepped portion 72c formed on the side wall 71c will be described with reference to FIGS. 5 and 6. Although not illustrated, the same description is applied to the stepped portion 72a formed on the side wall 71a and the reservoirs 75c of the lid 75. In addition, the stepped portions 72b and 72d formed on the side walls 71b and 71d have the same configuration as the stepped portion 72c formed on the side wall 71c.

The stepped portion 72c is continuously formed all around the opening inner periphery 74c of the front surface of the side wall 71c of the frame portion 70. The stepped portion 72c includes a step inner peripheral surface 72c1, a step supporting surface 72c2, and a projection 72c3.

The step inner peripheral surface 72c1 is continuously formed along the opening inner periphery 74c on the front surface side of the side wall 71c to face the housing space 72 in plan view. The step inner peripheral surface 72c1 is parallel to the Z-X plane. In addition, the height of the step inner peripheral surface 72c1 is approximately equal to the thickness (height) of the lid 75.

The step supporting surface 72c2 is continuously formed along the opening inner periphery 74c of the side wall 71c to face the +Z direction and is orthogonal to the step inner peripheral surface 72c1. The width (length in the +Y direction in FIG. 6) of the step supporting surface 72c2 may be set so as to support the lid 75. The size of the step supporting surface 72c2 is set so that, when the lid 75 is attached to the stepped portion 72c, a gap G is formed between the step inner peripheral surface 72c1 and the lateral surface 75c2 of the lid 75. This gap G may be set to 0.2 mm to 0.3 mm, inclusive, for example.

The projection 72c3 is formed on the step supporting surface 72c2 to extend vertically upward (in the +Z direction). The height of the projection 72c3 is set so as not to project from the front surface 75a of the lid 75. The present embodiment describes the case where the height of the projection 72c3 is so set as not to penetrate through the reservoir 75c. However, the height of the projection 72c3 may be set so that the projection 72c3 penetrates through the reservoir surface 75c1 of the lid 75 but does not project from the reservoir 75c (front surface 75a). In this case, the adhesive material 96 accumulated in the reservoir 75c adheres to the projection 72c3 penetrating through the reservoir surface 75c1 inside the reservoir 75c. This improves the bonding force of the lid 75 to the stepped portion 72c. The projection 72c3 may have a columnar shape and be circular or rectangular in plan view. The projection 72c3 may have a semispherical shape. The projection 72c3 may only be formed on the step supporting surface 72c2. The present embodiment describes, as an example, the case where the projection 72c3 is formed at a position on the step supporting surface 72c2 corresponding to the reservoir 75c formed in the lid 75.

The reservoir 75c in the lid 75 is formed on the outer periphery of the front surface 75a so as to extend from the lateral surface 75c2 toward the inner side in plan view. The reservoir 75c includes a reservoir surface 75c1 that has an area positioned at a level lower than the front surface 75a at least on the side where the lateral surface 75c2 is positioned, and inner surfaces 75c3 and 75c4 formed at both sides of the reservoir surface 75c1 in the ±X directions.

The reservoir surface 75c1 of the reservoir 75c of the present embodiment connects to the lateral surface 75c2 and is inclined upward from the lateral surface 75c2 toward the front surface 75a. Therefore, the reservoir surface 75c1 includes an area positioned at a level lower than the front surface 75a on the side where the lateral surface 75c2 is positioned. In this connection, as described earlier, the lateral surface 75c2 is approximately parallel to the step inner peripheral surface 72c1. The height of the lateral surface 75c2 corresponding to the reservoir 75c is approximately half the height of the lid 75. If the height of the lateral surface 75c2 corresponding to the reservoir 75c is less than this, the reservoir 75c decreases its strength and thus may be broken, which may cause a damage in the lid 75. If the height of the lateral surface 75c2 corresponding to the reservoir 75c is greater than that, the capacity of the reservoir 75c is limited to a certain amount that is insufficient for the accumulation of the adhesive material 96. If it is not possible to accumulate the adhesive material 96 sufficiently, more reservoirs 75c need to be formed or the reservoirs 75c need to be formed such that their reservoir surfaces 75c1 have a sufficient area. This may increase the cost to form the reservoirs 75c.

The inner surfaces 75c3 and 75c4 connect the reservoir surface 75c1 and the front surface 75a. The inner surfaces 75c3 and 75c4 are parallel to the Z-Y plane. In this connection, each of the inner surfaces 75c3 and 75c4 and the reservoir surface 75c1 do not need to be connected orthogonally, but may be connected in a curved shape. Further, each inner surface 75c3 and 75c4 may become wider toward the front surface 75a. Still further, the reservoir surface 75c1 and the lateral surface 75c2 do not need to be connected orthogonally, but may be connected in an R-shape.

In addition, the fixing hole 75b1 is formed in the rear surface 75b of the lid 75. The fixing hole 75b1 is formed so that, when the lid 75 is placed on the stepped portion 72c, the fixing hole 75b1 is positioned to correspond to the projection 72c3. The fixing hole 75b1 may only need to have a shape that allows the projection 72c3 to be inserted therein, and is formed according to the shape of the projection 72c3. The fixing hole 75b1 may be formed to penetrate through the lid 75, depending on the height of the projection 72c3. The present embodiment describes, as an example, the case where the fixing hole 75b1 does not penetrate through the lid 75.

The following describes attachment of the lid 75 to the case 50 (frame portion 70) and application of the adhesive material 96. First, the lid 75 is attached to the stepped portions 72a, 72b, 72c, and 72d of the side walls 71a, 71b, 71c, and 71d of the frame portion 70.

Then, the adhesive material 96 is injected in the gap G between the stepped portions 72a, 72b, 72c, and 72d of the side walls 71a, 71b, 71c, and 71d and the lid 75. In this connection, the lid 75 is fixed to the stepped portions 72a, 72b, 72c, and 72d by the projections 72a3, 72b3, 72c3, and 72d3. Therefore, the gap G from the lateral surfaces 75a2, 75b2, 75c2, and 75d2 of the lid 75 is kept equal and constant.

The adhesive material 96 may be injected directly in the gap G. Alternatively, the adhesive material 96 may be injected from a reservoir 75c toward the gap G. In this case, the reservoir 75c serves as a guide for allowing the adhesive material 96 to flow. That is, the adhesive material 96 injected in the reservoir 75c flows through the reservoir surface 75c1 of the reservoir 75c to the gap G. Especially, since the reservoir surface 75c1 is inclined, the adhesive material 96 flows into the gap G without fail. The adhesive material 96 flowing into the gap G in this way entirely fills the gap G. In this connection, as described earlier, the gap G all around the sides is approximately equal and kept constant. The adhesive material 96 flowing from the reservoir 75c is easy to flow to the entire gap G stably since the gap G has no uneven part.

For example, as the adhesive material 96 used here, a thermosetting resin-based adhesive agent or an organic-based adhesive agent is used. For example, the thermosetting resin-based adhesive agent contains an epoxy resin or a phenolic resin as a principal component. The organic-based adhesive agent is an elastomer-based adhesive agent containing silicone rubber or chloroprene rubber as a principal component. The adhesive material 96 preferably contains an epoxy resin or silicone rubber as a principal component. The adhesive material 96 may contain the same components as the adhesive material 60a. However, the adhesive material 96 preferably has higher liquidity than the adhesive material 60a. This allows the adhesive material 96 flowing from the reservoir 75c to spread all over the gap G easily.

In addition, the adhesive material 96 that fills the gap G is accumulated in the reservoirs 75c. Therefore, it is possible to prevent the adhesive material 96 from protruding from the gap G and thus to prevent a waste of the adhesive material 96. Since the protrusion of the adhesive material 96 is prevented, the adhesive material 96 is prevented from adhering to the lid 75 and the case 50, which prevents defacing of the semiconductor device 10.

By solidifying the adhesive material 96 filling the gap G and being accumulated in the reservoirs 75c, the lid 75 is firmly fixed to the stepped portions 72a, 72b, 72c, and 72d of the frame portion 70. Since the adhesive material 96 not only fills the gap G but also flows in the reservoirs 75c, the adhesive area between the adhesive material 96 and the lid 75 increases, as compared with the case where the reservoirs 75c are not formed. Therefore, the bonding force of the lid 75 to the frame portion 70 (case 50) via the adhesive material 96 is improved.

Modification Example 2-1

Figure 7:
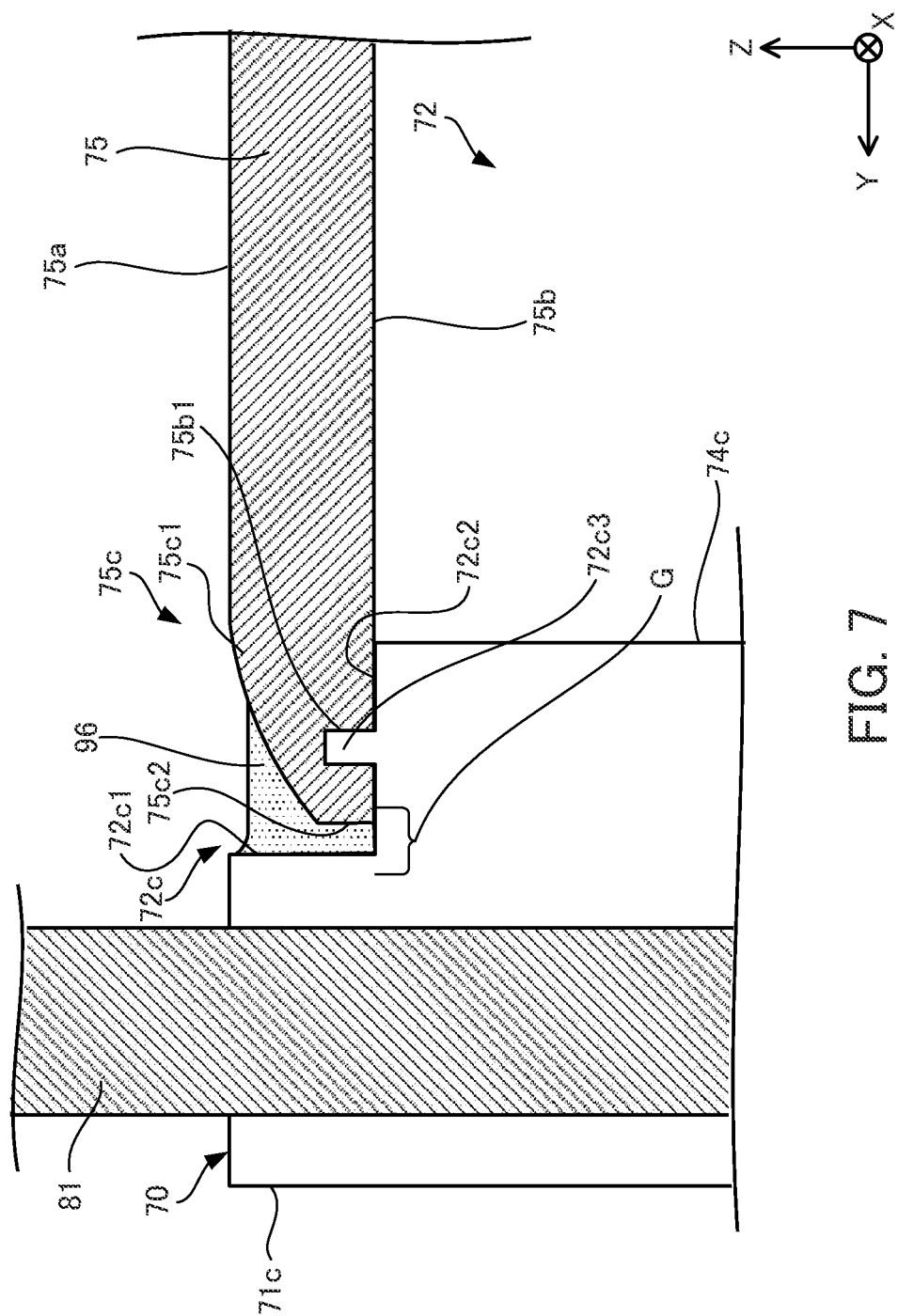
FIG. 7 is a sectional view of an area where a lid and a case are attached to each other in a semiconductor device according to a modification example 2-1 of the second embodiment.

A modification example 2-1 of the second embodiment will now be described with reference to FIG. 7. FIG. 7 is a sectional view of an area where a lid and a case are attached to each other in a semiconductor device according to the modification example 2-1 of the second embodiment. In this connection, FIG. 7 illustrates a reservoir surface 75c1 of a reservoir 75c that is different from that of FIG. 6, and the other structure is the same as that of FIG. 6.

As illustrated in FIG. 7, in the reservoir 75c of the modification example 2-1, the reservoir surface 75c1 connects the front surface 75a and the lateral surface 75c2 in a curved shape. That is, in the reservoir 75c of the modification example 2-1, the edges of the front surfaces 75a of the lateral surface 75c2 of the lid 75 are rounded. This reservoir 75c provides the same effects as the reservoir 75c of FIG. 6.

In this connection, a plurality of convex portions may be formed in a distributed manner on the reservoir surfaces 3c1 and 75c1 and inner surfaces 3c3, 3c4, 75c3, and 75c4 of the reservoirs 3c and 75c of FIGS. 1, 6, and 7 as appropriate. These convex portions increase the adhesive area of the adhesive material 96 accumulated in the reservoirs 75c to the reservoirs 75c and improves the bonding force therebetween.

Modification Example 2-2

Figure 8:
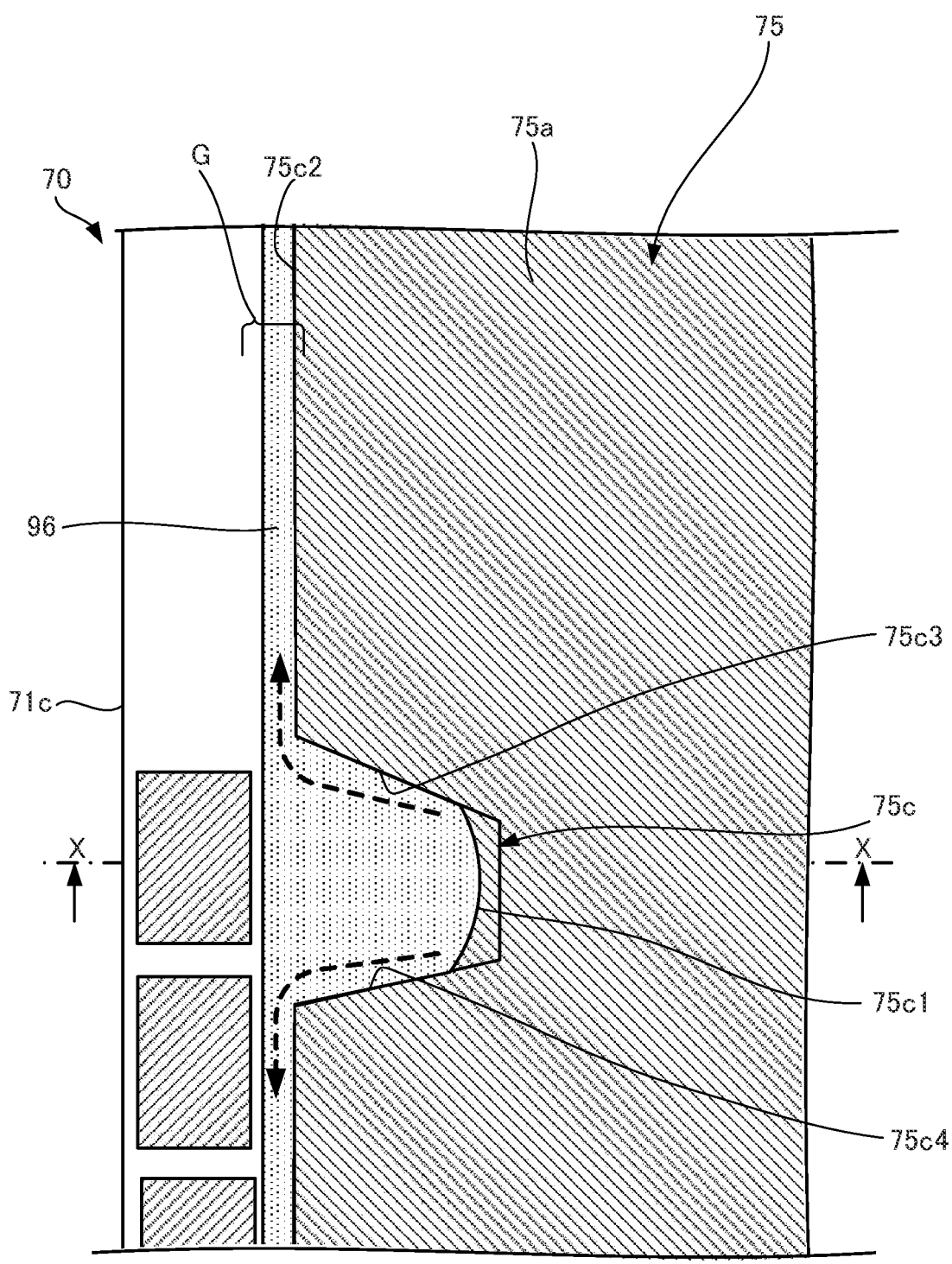
FIG. 8 is a plan view of an area where a lid and a case are attached to each other in a semiconductor device according to a modification example 2-2 of the second embodiment.

A modification example 2-2 of the second embodiment will now be described with reference to FIG. 8. FIG. 8 is a plan view of an area where a lid and a case are attached to each other in a semiconductor device according to the modification example 2-2 of the second embodiment. In this connection, FIG. 8 illustrates inner surfaces 75c3 and 75c4 of a reservoir 75c that are different from those of FIG. 5, and the other structure is the same as that of FIG. 5.

The inner surfaces 75c3 and 75c4 of the reservoir 75c of the modification example 2-2 are inclined in plan view. More specifically, the spacing between the inner surfaces 75c3 and 75c4 becomes wider toward the lateral surface 75c2. In other words, the spacing between the inner surfaces 75c3 and 75c4 becomes narrower as they go from the lateral surface 75c2 in the +X direction. Since the spacing between the inner surfaces 75c3 and 75c4 becomes wider toward the gap G, the adhesive material 96 flows from the reservoir 75c in the gap G easily. In addition, in this case, a groove may be formed along the inner surfaces 75c3 and 75c4 in the reservoir surface 75c1 to promote the adhesive material 96 to flow to the gap G. In addition, the spacing between the inner surfaces 75c4 and 75c4 may be formed to become wider in the +Z direction. This makes the adhesive material 96 to flow in the gap G more easily.

Third Embodiment

Figure 9:
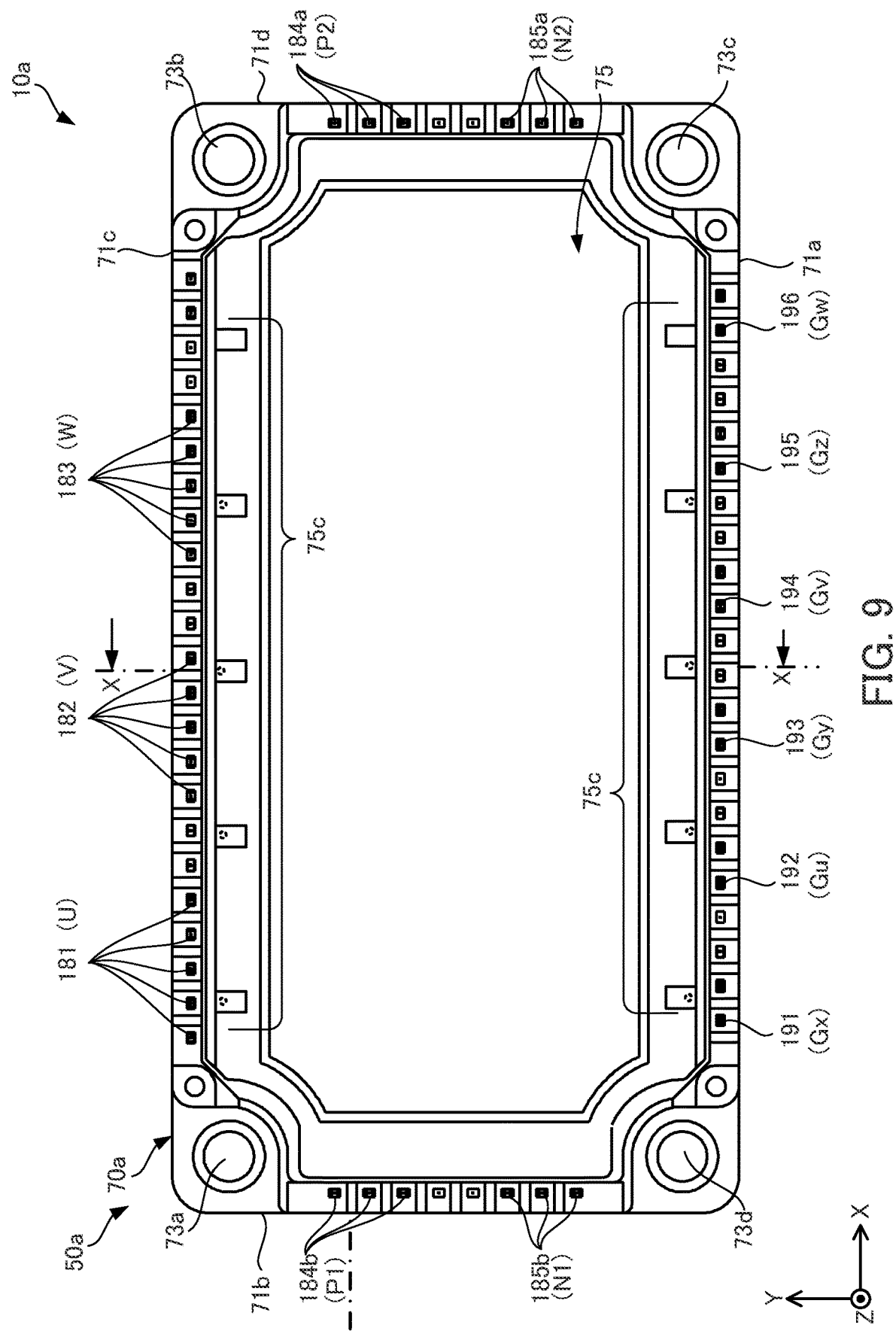
FIG. 9 is a plan view of a semiconductor device according to a third embodiment.
Figure 10:
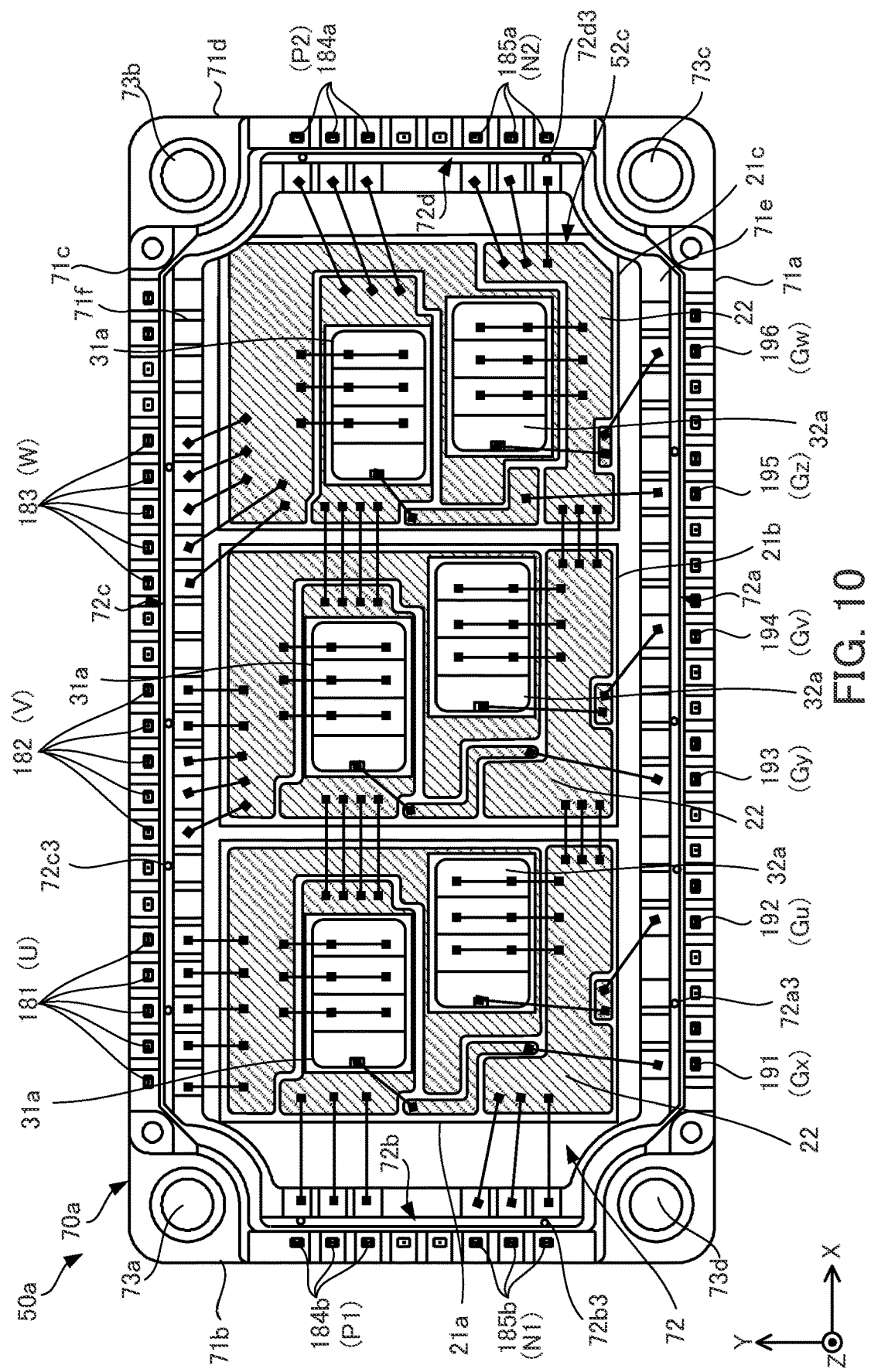
FIG. 10 is a plan view of the inside of the semiconductor device according to the third embodiment.
Figure 11:
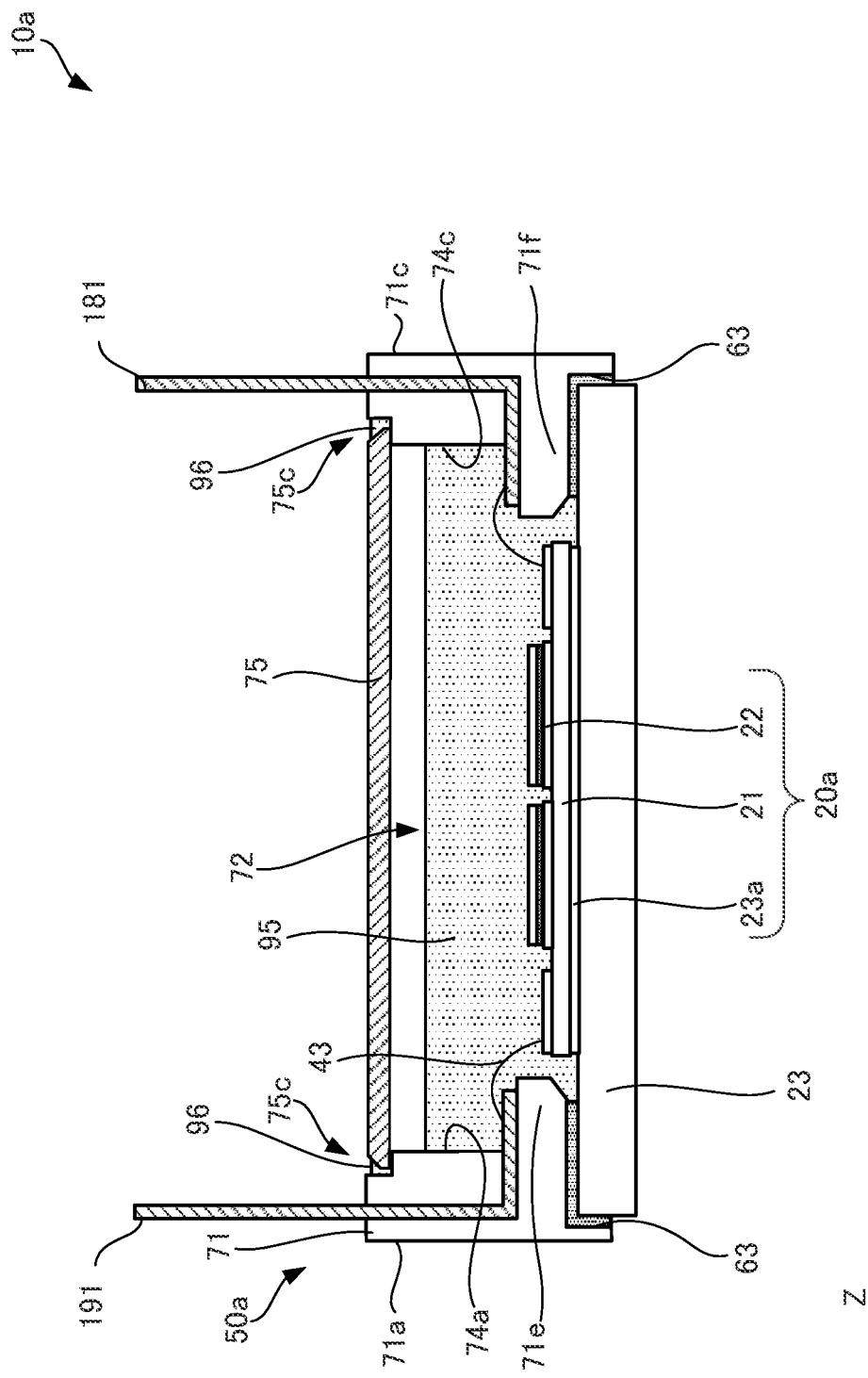
FIG. 11 is a sectional view of the semiconductor device according to the third embodiment.

In a third embodiment, a semiconductor device different from that of the second embodiment will be described with reference to FIGS. 9 to 11. FIG. 9 is a plan view of the semiconductor device according to the third embodiment. FIG. 10 is a plan view of the inside of the semiconductor device according to the third embodiment. FIG. 11 is a sectional view of the semiconductor device according to the third embodiment. In this connection, FIG. 11 is a sectional view taken along the dash-dotted line X-X of FIG. 9. The same reference numerals as used in the second embodiment are given to the corresponding components and the description of them may be omitted or simplified.

The semiconductor device 10a of the third embodiment includes an insulated circuit substrate 20a, a case 50a for accommodating the insulated circuit substrate 20a, and a lid 75. The inside of the case 50a is sealed with a sealing material 95. In addition, a metal base substrate 23 is exposed downward (in the −Z direction) from the rear surface of the case 50a of the semiconductor device 10a.

The case 50a is rectangular in plan view. The case 50a includes a frame portion 70a and fastening holes 73a, 73b, 73c, and 73d. The frame portion 70a is rectangular (frameshaped) in plan view. The frame portion 70a has a housing space 72 at the center thereof, and has side walls 71a, 71b, 71c, and 71d in order at the four sides of the housing space 72. More specifically, the side walls 71a and 71c are arranged at the long sides of the frame portion 70a, and the side walls 71b and 71d are arranged at the short sides thereof. In this connection, the frame portion 70a may only have flat side walls 71a, 71b, 71c, and 71d at the four sides of the rectangle and may have a curve (curved surface) at each corner.

As in the second embodiment, the side walls 71a, 71b, 71c, and 71d have stepped portions 72a, 72b, 72c, and 72d. Projections 72a3, 72b3, 72c3, and 72d3 are formed at the stepped portions 72a, 72b, 72c, and 72d.

In addition, a plurality of terminals extend vertically upward (in the +Z direction) from the front surface of the frame portion 70a along the front surface of the frame portion 70a. The plurality of terminals include external connection terminals for the main electrodes, control, and output of an insulated circuit substrate (invertor), which will be described later. The external connection terminals for main electrode include second P terminals 184a, second N terminals 185a, first P terminals 184b, and first N terminals 185b. The second P terminals 184a and second N terminals 185a are formed on the side wall 71d so as to be aligned in the direction from the side wall 71c toward the side wall 71a. The first P terminals 184b and first N terminals 185b are formed on the side wall 71b so as to be aligned in the direction from the side wall 71c toward the side wall 71a.

The external connection terminals for control include a Gx terminal 191, a Gu terminal 192, a Gy terminal 193, a Gv terminal 194, a Gz terminal 195, and a Gw terminal 196, which are formed on the side wall 71a so as to be aligned in the direction from the side wall 71b toward the side wall 71d. The Gx terminal 191, Gu terminal 192, Gy terminal 193, Gv terminal 194, Gz terminal 195, and Gw terminal 196 each have one end extending upward from the top surface of the side wall 71a. In addition, the Gx terminal 191, Gu terminal 192, Gy terminal 193, Gv terminal 194, Gz terminal 195, and Gw terminal 196 each have the other end exposed on the terminal stepped portion 71e.

The external connection terminals for output include U terminals 181, V terminals 182, and W terminals 183, which are formed on the side wall 71c so as to be aligned in the direction from the side wall 71b toward the side wall 71d. The U terminals 181, V terminals 182, and W terminals 183 each have one end extending upward from the top surface of the side wall 71c. In addition, the U terminals 181, V terminals 182, and W terminals 183 each have the other end exposed on the terminal stepped portion 71f.

The plurality of terminals are made of a material with high electrical conductivity, such as copper, aluminum, iron, or an alloy containing at least one of these. In addition, plating may be performed on the surfaces of the plurality of terminals using, for example, nickel, gold, tin, and an alloy containing at least one of these, to improve their corrosion resistance.

The semiconductor device 10a configured as above includes an inverter circuit. The inverter circuit is designed to convert direct current to alternating current. Direct current input from the second P terminals 184a and first P terminals 184b with high potential and the second N terminals 185a and first N terminals 185b with low potential is converted by a plurality of semiconductor chips 31a and 32a to three-phase alternating current, which is then output from the U terminals 181, V terminals 182, and W terminals 183.

The lid 75 is provided so as to cover the opening of the housing space 72 for accommodating the components (semiconductor chips and others) of the semiconductor device 10a (see FIG. 9). The fastening holes 73a, 73b, 73c, and 73d are provided at the four corners of the frame portion 70a in plan view. Screws are inserted into the fastening holes 73a, 73b, 73c, and 73d. The semiconductor device 10a is attached to a predetermined position by inserting the screws into the fastening holes 73a, 73b, 73c and 73d. These screws pass through the fastening holes 73a, 73b, 73c, and 73d and also, for example, into the through holes (which will be described later) of a cooling unit, so that the cooling unit is screwed together with the case 50a.

This case 50a is made of the same resin as used in the second embodiment and is formed by integral molding with the plurality of terminals in the same manner as in the second embodiment. The lid 75 is formed separately, using the same material as the case 50a. The same metal base substrate 23 as used in the second embodiment is used here. Such a metal base substrate 23 is firmly fixed to the rear opening 63 of the rear surface of the frame portion 70 via an adhesive material.

In addition, in the semiconductor device 10a, three insulated circuit substrates 20a are disposed along the side walls 71a and 71c in the housing space 72 of the case 50a on the metal base substrate 23. Each insulated circuit substrate 20a includes an insulating plate 21, circuit patterns 22 formed on the insulating plate 21, and a metal plate 23a formed on the rear surface of the insulating plate 21. The insulating plate 21 and circuit patterns 22 are made of the same materials as used in the second embodiment. Note that the shapes and quantity of the circuit patterns 22 are different from those provided in the second embodiment.

The metal plate 23a is formed on the entire rear surface of the insulating plate 21 except the outer periphery thereof. The metal plate 23a is made of a metal with high thermal conductivity as a principal component. Examples of the metal include copper, aluminum, and an alloy containing at least one of these. The thickness of the metal plate 23a is in the range of 0.1 mm to 5.0 mm, inclusive. Plating may be performed on the surface of the metal plate 23a to improve its corrosion resistance. Examples of the plating material used here include nickel, a nickel-phosphorus alloy, and a nickel-boron alloy.

As each insulated circuit substrate 20a configured as above, a DCB substrate or AMB substrate may be used, for example. The insulated circuit substrate 20a is able to transfer heat generated by the semiconductor chips 31a and 32a through the circuit patterns 22, insulating plate 21, and metal plate 23a to the outside.

The semiconductor chips 31a and 32a are made of silicon, silicon carbide, or gallium nitride as a principal component. The semiconductor chips 31a and 32a include reverse-conducting (RC)-IGBT chips. The semiconductor chips 31a and 32a of this type each have an input electrode (collector electrode) serving as a main electrode on the rear surface thereof and have a gate electrode serving as a control electrode and an output electrode (emitter electrode) serving as a main electrode on the front surface thereof.

The above insulated circuit substrates 20a and the semiconductor chips 31a and 32a are accommodated, and the circuit patterns 22, semiconductor chips 31a and 32a, and the plurality of terminals are electrically and mechanically connected as appropriate with wires (reference numerals not given). As a result, the inverter circuit is provided in the housing space 72.

As in the second embodiment, reservoirs 75c are formed in the lid 75 that covers the insulated circuit substrates 20a and semiconductor chips 31a and 32a accommodated in the frame portion 70a of the case 50a. In the third embodiment, five reservoirs 75c are formed at each of the opposite long sides of the front surface 75a of the lid 75. Note that, as described earlier, the reservoirs 75c are formed, taking into consideration the warpage of the case 50a caused by screwing through the fastening holes 73a, 73b, 73c, and 73d.

In addition, some of the reservoirs 75c are formed at positions corresponding to the centers of the side walls 71a and 71c of the frame portion 70a, in the lid 75. When the semiconductor device 10a repeatedly experiences temperature changes during operation, it is warped due to a difference in linear expansion coefficient among its components. Since the semiconductor device 10a is rectangular in plan view, it is warped in a concave or convex shape with its center as a vertex in plan view. At this time, stress is generated at the centers of the side walls 71a and 71c and the centers of the side walls 71b and 71d. If no reservoir 75c is formed in the lid 75, the lid 75, even bonded to the frame portion 70a using the adhesive material 96, may be separated from the frame portion 70a due to such stress. By contrast, by forming the reservoirs 75c at the positions where the stress is to be generated, the reservoirs 75c improve the bonding force of the adhesive material 96 and thus prevent the separation of the lid 75 from the frame portion 70a.

The third embodiment describes the case where no reservoir 75c is formed on the sides of the lid 75 where the side walls 71b and 71d are positioned. In the case where reservoirs 75c are formed on the sides of the lid 75 where the side walls 71b and 71d are positioned, the reservoirs 75c are preferably formed at positions corresponding to the centers of the side walls 71b and 71d.

In addition, the reservoirs 75c of the third embodiment may be formed such that their reservoir surfaces are parallel to the front surface 75a, as with the reservoirs 3c of the first embodiment. In addition, the reservoirs 75c of the third embodiment may be formed such that their reservoir surfaces are curved as illustrated in FIG. 7 or the spacing between their opposite inner surfaces gradually become wider as illustrated in FIG. 8.

The disclosed techniques make it possible to prevent an increase in the size of a semiconductor device and to prevent protrusion of an adhesive material.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a semiconductor element;
   a case including a frame portion, which is of a frame shape having an opening in a plan view of the semiconductor device, the frame portion having
      a front surface, and
      an inner periphery that surrounds a housing space for accommodating the semiconductor element; and
   a lid having a flat plate shape, the lid covering an upper side of the housing space, wherein
   the inner periphery of the frame portion has a stepped portion formed thereon, the stepped portion including a step supporting surface positioned at a level lower than the front surface of the frame portion and being approximately parallel to the front surface of the frame portion,
   the lid has
      a front surface and a bottom surface, and
      a lateral surface surrounding the lid, the lateral surface being bonded to the stepped portion via an adhesive material, such that the front surface and the bottom surface of the lid are approximately parallel to the step supporting surface, and
   the lid has a reservoir formed in the front surface thereof and extending from the lateral surface, the reservoir having a reservoir surface substantially lower than the front surface of the lid.

2. The semiconductor device according to claim 1, wherein the reservoir surface is inclined upward from the lateral surface of the lid toward the front surface of the lid in a sectional view of the semiconductor device.

3. The semiconductor device according to claim 1, wherein the reservoir surface is curved in a sectional view of the semiconductor device.

4. The semiconductor device according to claim 1, wherein the reservoir surface is approximately parallel to the front surface of the lid in a sectional view of the semiconductor device.

5. The semiconductor device according to claim 1, wherein the stepped portion is continuously formed along the entire inner periphery of the frame portion.

6. The semiconductor device according to claim 5, wherein
   the frame portion has a projection formed on the step supporting surface of the stepped portion, and
   the bottom surface of the lid at an outer periphery thereof engages with the projection so that the lid is supported by the step supporting surface.

7. The semiconductor device according to claim 1, wherein
   the stepped portion further includes an inner peripheral surface connected to the step supporting surface and being approximately perpendicular to the step supporting surface, and
   the lid is disposed such that the lateral surface of the lid is approximately parallel to the inner peripheral surface of the stepped portion, with a gap therebetween.

8. The semiconductor device according to claim 7, wherein the gap is filled with the adhesive material.

9. The semiconductor device according to claim 1, wherein the reservoir surface of the reservoir in the lid bonded to the stepped portion connects to the lateral surface, and the lateral surface is approximately parallel to an inner peripheral surface of the stepped portion.

10. The semiconductor device according to claim 1, wherein a front surface of the adhesive material is positioned at a level lower than the front surface of the frame portion.

11. The semiconductor device according to claim 1, wherein the reservoir is formed at an outer periphery of the lid.

12. The semiconductor device according to claim 11, wherein
   the front surface of the lid has two sides opposite to each other, and the reservoir is provided in two, each formed at least at a center of one of the two sides in the plan view.

13. The semiconductor device according to claim 11, wherein
the frame portion of the case has two sides opposite to each other,
the case further includes two fastening holes respectively at the two opposite sides in the plan view, the fastening hole being open in a direction substantially perpendicular to the front surface of the frame portion, and
the reservoir is provided in two, each formed at a position corresponding to one of the fastening holes.

14. The semiconductor device according to claim 1, wherein the reservoir surface has a rectangular shape in the plan view.

15. The semiconductor device according to claim 1, wherein in the plan view, the reservoir surface has a trapezoid shape, including a first side and a second side that is parallel to the first side and shorter than the first side, the first side overlapping the lateral surface of the lid.

16. The semiconductor device according to claim 1, wherein
the lid further includes a positioning member at a predetermined position on the front surface of the lid and extend vertically upward, and
the reservoir is formed at an area other than a vicinity of the predetermined position.

17. The semiconductor device according to claim 1, wherein the reservoir is continuously formed along an entire outer periphery of the lid.

18. The semiconductor device according to claim 1, wherein the case further includes an external connection terminal integrally formed with the frame portion, the external connection terminal having two ends, one end thereof extending vertically upward from the front surface of the frame portion and the other end thereof extending into the housing space.

* * * * *